United States Patent
Yu

(10) Patent No.: US 8,760,570 B2
(45) Date of Patent: Jun. 24, 2014

(54) CAMERA MODULE AND METHOD FOR MAKING SAME

(71) Applicant: Yun-Kai Yu, New Taipei (TW)

(72) Inventor: Yun-Kai Yu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/663,506

(22) Filed: Oct. 30, 2012

(65) Prior Publication Data

US 2014/0036218 A1  Feb. 6, 2014

(30) Foreign Application Priority Data

Aug. 6, 2012 (TW) .............................. 101128334 A

(51) Int. Cl.
  *H04N 5/225* (2006.01)
  *H04N 5/335* (2011.01)

(52) U.S. Cl.
  USPC ............................ 348/373; 348/340; 348/294

(58) Field of Classification Search
  CPC . H04N 5/2251; H04N 5/2252; H04N 5/2253; H04N 5/2254; H04N 13/0239; H04N 2005/2255; H04N 13/0296; H04N 13/0055; H04N 5/2257; G08B 13/19619; A61B 1/00193; H01L 27/14627; H01L 27/14625

USPC .................. 348/340, 373–375, 45, 340.992
  See application file for complete search history.

(56) References Cited

U.S. PATENT DOCUMENTS

| | | | |
|---|---|---|---|
| 2008/0142917 A1* | 6/2008 | Lee et al. | 257/432 |
| 2008/0252774 A1* | 10/2008 | Chen et al. | 348/374 |
| 2012/0120298 A1* | 5/2012 | Chiu et al. | 348/335 |
| 2012/0140101 A1* | 6/2012 | Afshari et al. | 348/308 |

* cited by examiner

*Primary Examiner* — Tuan Ho
*Assistant Examiner* — Selam Gebriel
(74) *Attorney, Agent, or Firm* — Novak Druce Connolly Bove + Quigg LLP

(57) ABSTRACT

A camera module includes a lens module having a lens holder having a top surface, a bottom surface, a side surface and a through hole through the top surface and the bottom surface, a liquid crystal lens, wires, and a driving unit, a PCB, and solder balls. The liquid crystal lens is received in the through hole. The wires are arranged on the top surface and the side surface. One end of each wire is electrically connected to the liquid crystal lens, and the other end includes a solder terminal on the side surface. The driving unit drives the liquid crystal lens. The PCB includes a rigid print circuit board supporting the lens holder and a flexible print circuit board having a free end bent toward the side surface. The solder balls interconnect the solder terminals and the free end.

8 Claims, 4 Drawing Sheets

CAMERA MODULE AND METHOD FOR MAKING SAME

BACKGROUND

1. Technical Field

The present disclosure relates to camera modules, and also to a method for making the camera modules.

2. Description of Related Art

Optical zooming is a common function of camera modules. A liquid crystal lens is driven by a driving unit to change the focal length to achieve optical zooming in the camera module. Hence, it is important to make the liquid crystal lens to electrically connect to the driving unit.

DETAILED DESCRIPTION

Figure 1:
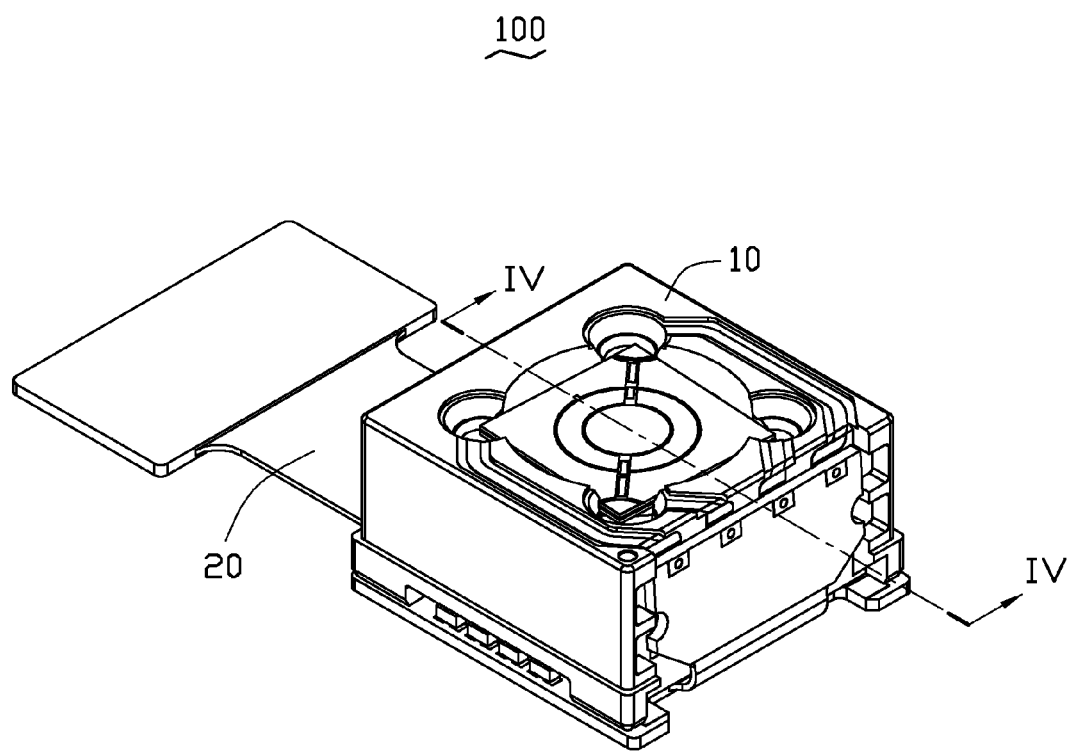
FIG. 1 is a schematic, isometric view of a camera module including a print circuit board, according to an exemplary embodiment.
Figure 2:
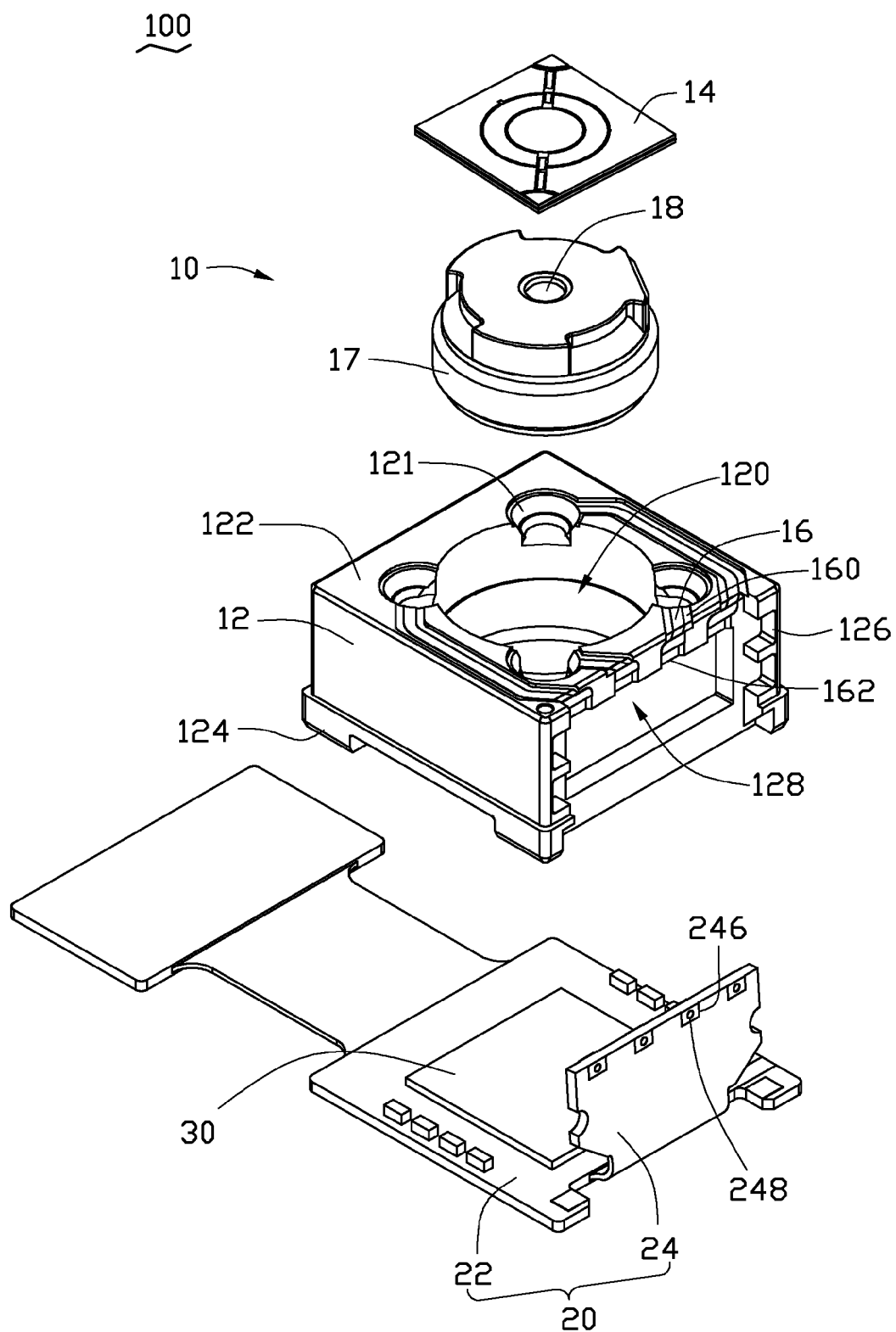
FIG. 2 is an exploded view of the camera module of FIG. 1.
Figure 3:
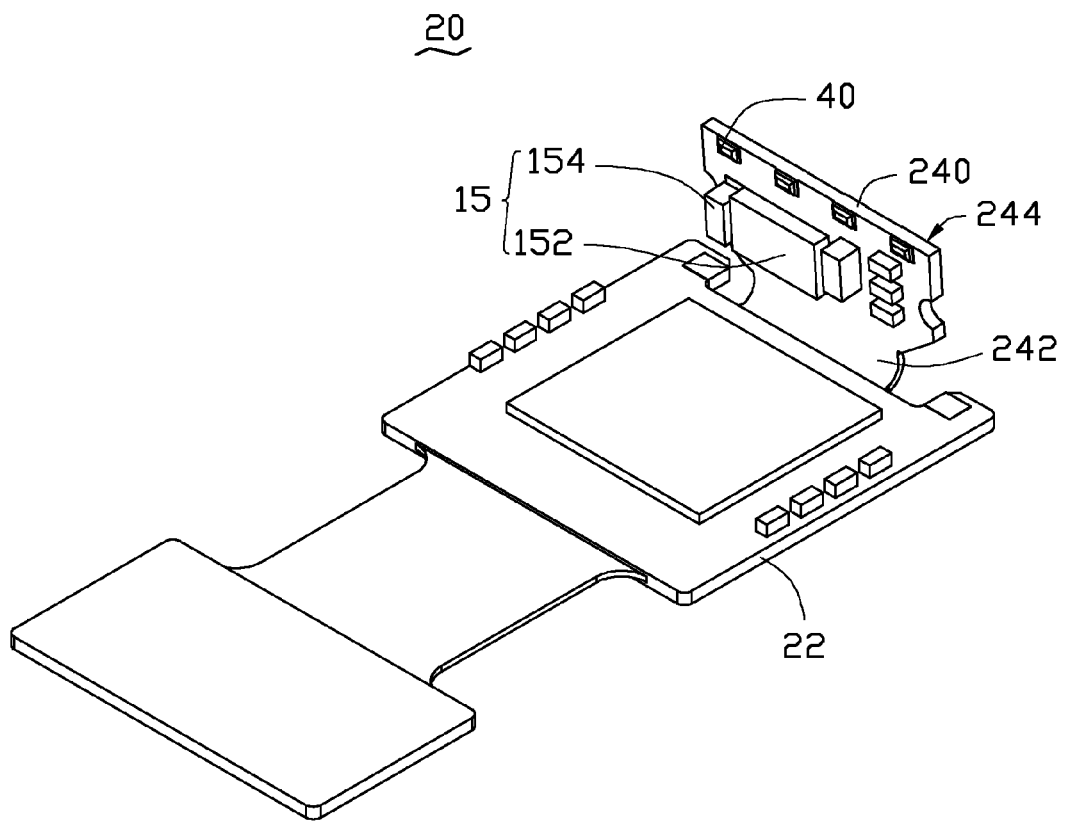
FIG. 3 is a schematic, isometric view of the print circuit board of the camera module of FIG. 1.

Referring to FIGS. 1-3, a camera module 100, according to an exemplary embodiment, is shown. The camera module 100 includes a lens module 10, a print circuit board 20, an image sensor 30, and four solder balls 40. In this embodiment, the print circuit board 20 is a rigid-flexible print circuit board.

The lens module 10 includes a lens holder 12, a liquid crystal lens 14, a driving unit 15, four wires 16, a lens barrel 17, and an optical lens group 18.

The lens holder 12 is substantially a cuboid. The lens holder 12 includes a top surface 122, a bottom surface 124, and four side surfaces 126. The top surface 122 and the bottom surface 124 are positioned at opposite sides of the lens holder 12. The side surfaces 126 connect to each other end-to-end and perpendicularly connect the top surface 122 to the bottom surface 124. A through hole 120 is defined in the lens holder 12 and passes through the top surface 122 and the bottom surface 124. Four corner recesses 121 are defined in the top surface 122 at four corners of the through hole 120. One of the side surfaces 126 defines a receiving recess 128. Four wire grooves 160 are defined in the top surface 122 and the side surface 126 corresponding to the corner recesses 121. In one embodiment, one end of each wire groove 160 communicates with a corresponding corner recess 121, and the other end communicates with the receiving recess 128.

The liquid crystal lens 14 is received in the through hole 120. In one embodiment, the liquid crystal lens 14 is substantially cuboid-shaped. Four corners of the liquid crystal lens 14 are received in the four corner recesses 121 respectively.

The driving unit 15 is attached to the print circuit board 20 and configured for driving the liquid crystal lens 14 to zoom. The driving unit 15 includes a drive IC 152 and a number of electronic units 154.

The wires 16 are received in the respective wire grooves 160. In detail, the wires 16 extend from the corner recesses 121 to the receiving recess 128. That is, one end of each wire 16 is electrically connected to a corner of the liquid crystal lens 14, and the other end of each wire 16 includes a solder terminal 162 adjacent to the receiving recess 128. As such, the camera module 100 can be compact in design.

The lens barrel 17 is received in the through hole 120. The liquid crystal lens 14 and the lens barrel 17 are arranged in the order written from the object side to the image side of the lens module 10. The optical lens group 18 is received in the lens barrel 17. The optical lens group 18 may include one or more non-zoom lenses made of glass or plastic. The optical lens group 18 and the liquid crystal lens 14 constitute an imaging lens system for the camera module 100. Changes made to the focal length of the liquid crystal lens 14 results in changes of the effective focal length of the imaging lens system, thereby achieving optical zooming of the camera module 100. This can achieve a compact camera module 100 with optical zooming In another embodiment, the optical lens group 18 can be omitted, and the imaging lens system may only include the liquid crystal lens 14.

The print circuit board 20 includes a rigid print circuit board 22 and a flexible print circuit board 24 connecting to a side of the rigid print circuit board 22. The image sensor 30 is fixed on and electrically connected to the rigid print circuit board 22. The bottom surface 124 is supported by the flexible print board 22. The image sensor 30 is received in the through hole 120. The liquid crystal lens 14, the lens barrel 17, and the image sensor 30 are arranged in the order written from the object side to the image side of the lens module 10.

Figure 4:
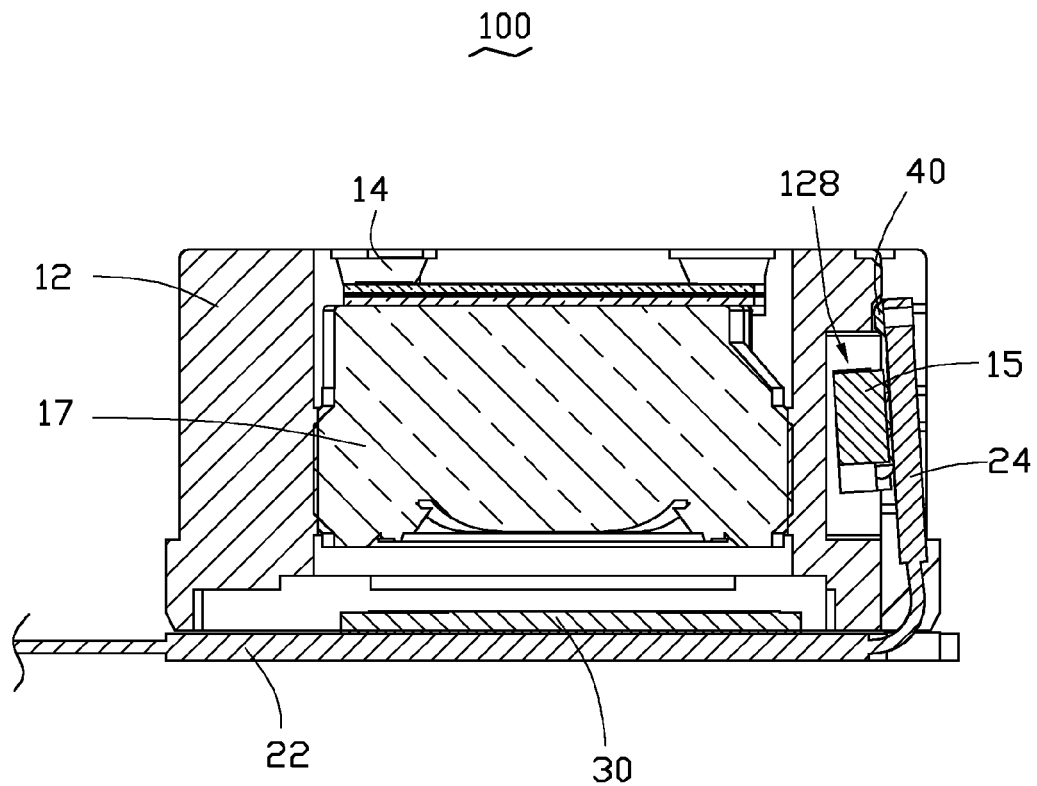
FIG. 4 is a sectional view of the camera module taken along the line IV-IV of FIG. 1.

Referring to FIG. 4, the flexible print circuit board 24 is fixed to the side surface 126 and includes a free end 240, a first surface 242, a second surface 244, and eight solder pads 246. The first surface 242 and the second surface 244 are positioned at opposite sides of the flexible print circuit board 24. The first surface 242 faces the side surface 126. The driving unit 15 is mounted on and electrically connected to the first surface 242, thereby receiving in the receiving holes 128. The eight solder pads 246 are arranged at the free end 240. In detail, four of the eight solder pads 246 are arranged on the first surface 242, and the other four solder pads 246 are arranged on the second surface 244 and correspond to the four solder pads 246 on the first surface 242. Four via holes 248 are defined in the free end 240. Each via hole 248 is aligned with a solder terminal 162 and connects the solder pads 246 on the first surface 242 and the corresponding solder pads 246 on the second surface 244.

Each solder ball 40 interconnects the solder pads 246 on the first surface 242 and the respective solder terminals 162 so that the print circuit board 20 is electrically connected to the liquid crystal lens 14 through the wires 16, thereby the driving unit 15 is electrically connected to the liquid crystal lens 14 and can drive the liquid crystal lens 14 to change the focal length of the liquid crystal lens 14 to perform optical zooming. Further, the solder ball 40 and the driving unit 15 are received in the receiving recess 128, thus, the camera module 100 can be more compact in design.

A method for making the camera module 100, according to a second embodiment, is also provided. The method includes the following steps:

First, a print circuit board 20 and solder paste are provided. In detail, The print circuit board 20 includes a rigid print circuit board 22 and a flexible print circuit board 24 connecting to a side of the rigid print circuit board 22. The flexible print circuit board 24 includes a free end 240, a first surface 242, a second surface 244 opposite to the first surface 242, and eight solder pads 246. Four via holes 248 are defined in the free end 240. The eight solder pads 246 are arranged at the free end 240. In detail, four of the eight solder pads 246 are arranged on the first surface 242, and the other four solder pads 246 are arranged on the second surface 244 and correspond to the four solder pads 246 on the first surface 242. Each via hole 248 is aligned with a solder terminal 162 and connects the solder pads 246 on the first surface 242 and the corresponding solder pads 246 on the second surface 244.

Second, the solder paste is attached to the solder pads 246 on the first surface 242.

Third, a lens module 10 is provided. In detail, the lens module 10 includes a lens holder 12, a liquid crystal lens 14, a driving unit 15 mounted on the first surface 242, and four wires 16. The lens holder 12 includes a top surface 122, a bottom surface 124 opposite to the top surface 122, and a side surface 126 connecting the top surface 122 to the bottom surface 124, and a through hole 120 passing through the top surface 122 and the bottom surface 124. The side surface 126 defines a receiving recess 128. The liquid crystal lens 14 is received in the through hole 120. The wires 16 are formed on the top surface 122 and the side surface 126. Each wire 16 is electrically connected to the liquid crystal lens 16 and includes a solder terminal 162 on the side surface 126.

Fourth, the bottom surface 124 is positioned on the rigid print circuit board 22, and the flexible print circuit board 24 is bent toward the side surface 126 to insert the driving unit 15 in the receiving recess 128, and make the via holes 248 align with the respective solder terminals 162.

Fifth, the solder paste is heated to interconnect the solder terminals 162 and the solder pads 246 on the first surface 242.

Sixth, the solder paste is cooled so as to convert the solder paste into solder balls 40 each interconnecting the solder terminal 162 and the corresponding solder pad 246.

In the third step provided above, the lens module 10 is provided through steps S200 to S210. Step S200: the lens holder 12 using a laser-activated material is formed using an injection-molding process. Step S202: wire grooves 160 are defined in the top surface 122 and the side surface 126 using a laser beam. Step S204: the wires 16 are formed in the wire grooves 160. Step S206: the liquid crystal lens 14 is received in the through hole 120. Step S208: the liquid crystal lens 14 is electrically connected to the wires 16. Step S210: a driving unit 15 is attached on the flexible print circuit board 24 and is electrically connected to the wires 16, the driving unit 15 is configured for driving the liquid crystal lens 14 to zoom.

In the step S200, the laser-activated material can be selected from a group consisted of semi-aromatic polyamide, thermoplastic polyester, cross-linked polybutylene terephthalate, and liquid crystal polymer. The lens holder 12 is formed by a single-shot injection-molding process.

In the step S202, the laser beam may be emitted from a diode-pumped infrared laser generator. The wave length of the laser beam can be about 1064 nanometers.

In the step S204, forming the wires 16 in the wires grooves 160 includes sub-steps S240 through S242. Sub-step S240: the lens holder 12 with the wire grooves 160 is cleaned to remove any contaminants. Sub-step S242: the lens holder 12 is metalized to form the wires 16 in the wire grooves 160.

In the sub-step S242, metallization of the lens holder 12 is achieved with the help of current-free copper baths. This copper baths typically deposit a copper coating with the speed of about 3 μm-about 5 μm per hour on the lens holder 101. If a greater thickness of copper coating is required, this is achieved using standard electroforming copper baths. Furthermore, application-specific coatings such as Ni, Au, Sn, Sn/Pb, Ag, Ag/Pd, etc., can also be created.

Even though numerous characteristics and advantages of the present embodiments have been set fourth in the foregoing description, together with details of the structures and functions of the embodiments, the disclosure is illustrative only, and changes may be made in details, especially in the matters of shape, size, and arrangement of parts within the principles of the disclosure to the full extent indicated by the broad general meaning of the terms in which the appended claims are expressed.

What is claimed is:

1. A camera module comprising:
a lens module comprising:
a lens holder comprising a top surface, a bottom surface opposite to the top surface, a side surface connecting the top surface and the bottom surface, and a through hole passing through the top surface and the bottom surface, the side surface defining a receiving recess;
a liquid crystal lens received in the through hole;
a plurality of wires arranged on the top surface and the side surface, one end of each wire electrically connected to the liquid crystal lens, and the other end of each wire comprising a solder terminal positioned on the side surface; and
a driving unit configured for driving the liquid crystal lens to change the focal length to perform optical zooming;
a print circuit board comprising a rigid print circuit board and a flexible print circuit board connecting to the rigid print circuit board, the lens holder mounted on the rigid print circuit board, the driving unit mounted on the flexible print circuit board, the flexible print circuit board comprising a free end bent toward the side surface with the driving unit received in the receiving recess; and
a plurality of solder balls interconnecting the solder terminals and the free end.

2. The camera module as claimed in claim 1, wherein a plurality of corner recesses are defined in the top surface surrounding and communicating with the through hole, a plurality of wire grooves are defined in the top surface and the side surface, one end of each wire groove communicating with a corresponding corner recess, and the other end communicating with the receiving recess, the wires are received in the respective wire grooves, and corners of the liquid crystal lens are received in the respective corner recesses.

3. The camera module as claimed in claim 1, wherein the flexible printed circuit board further comprises a first surface facing the side surface, a second surface opposite to the first surface, and a plurality of solder pads arranged on the first surface and the second surface, solder pads on the first surface corresponds to the solder pads on the second surface, a plurality of via holes are defined at the free end interconnecting the solder pads on the first surface and the solder pads on the second surface, and the solder balls interconnect the respective solder terminals and the respective solder pads on the first surface.

4. The camera module as claimed in claim 1, wherein the lens module further comprises a lens barrel and an optical lens group received in the lens barrel, the lens barrel is received in the lens holder, and the liquid crystal lens and the lens barrel are arranged in the order written from the object side to the image side of the lens module.

5. The camera module as claimed in claim 1, further comprising an image sensor, wherein the image sensor is fixed on and electrically connected to the rigid printed circuit board, the image sensor is received in the through hole, and the liquid crystal lens, the lens barrel and the image sensor are arranged in the order written from the object side to the image side of the lens module.

6. A method for making a camera module, comprising:
providing a print circuit board and solder paste, the print circuit board comprising a rigid printed circuit board and a flexible printed circuit board connected to the rigid printed circuit board, the flexible print circuit board comprising a free end;

providing a lens module, the lens module comprising a lens holder, a liquid crystal lens, and a plurality of wires, the lens holder comprising a top surface, a bottom surface opposite to the top surface, and a side surface connecting the top surface to the bottom surface, and a through hole passing through the top surface and the bottom surface, the side surface defining a receiving recess, the liquid crystal lens received in the through hole, the wires formed on the top surface and the side surface, each wire being electrically connected to the liquid crystal lens and comprising a solder terminal on the side surface;

mounting a driving unit onto the flexible printed circuit board, the driving unit configured for driving the liquid crystal lens to perform optical zooming, bending the flexible printed circuit board toward the side surface to insert the driving unit in the receiving recess; and soldering the free end to the solder terminals.

7. The method for making the camera module as claimed in claim 6, wherein the flexible printed circuit board comprises a first surface facing the side surface and a second surface opposite to the first surface, the step of providing the print circuit board comprises:

forming via holes in the free end through the first surface and the second surface;

forming solder pads on the first surface and the second surface at opposite sides of each of the via holes; and attaching the solder paste to the solder pad on the first surface.

8. The method for making the camera module as claimed in claim 7, wherein the step of soldering the free end to the solder terminals comprises:

heating the solder paste to interconnect the solder terminals and the solder pads on the first surface; and cooling the solder paste so as to convert the solder paste into solder balls each interconnecting the solder terminal and the corresponding solder pad.

* * * * *